United States Patent [19]

Chandra et al.

[11] Patent Number: 5,629,889
[45] Date of Patent: May 13, 1997

[54] SUPERCONDUCTING FAULT-TOLERANT PROGRAMMABLE MEMORY CELL INCORPORATING JOSEPHSON JUNCTIONS

[75] Inventors: Premala Chandra; Lev B. Ioffe, both of Highland Park, N.J.

[73] Assignee: NEC Research Institute, Inc., Princeton, N.J.

[21] Appl. No.: 572,483

[22] Filed: Dec. 14, 1995

[51] Int. Cl.$^6$ .................................................. G11C 11/44
[52] U.S. Cl. ........................... 365/162; 257/31; 505/832; 505/841
[58] Field of Search ...................... 365/162, 160, 365/161; 327/31; 505/831, 832, 838, 841

[56] References Cited

U.S. PATENT DOCUMENTS

| | | | |
|---|---|---|---|
| 5,323,344 | 6/1994 | Katayama et al. | 365/162 |
| 5,434,530 | 7/1995 | Ghoshal et al. | 365/162 |
| 5,442,195 | 8/1995 | Saitoh et al. | 365/162 |

OTHER PUBLICATIONS

D.J. Dumin et al., "Application of Quantized Trapped Flux in Superconducting Memory" in J. Appl. Phys., 34, 1566–67, (1963).

B.D. Josephson, "Relation Between the Superfluid Density and Order Parameter $H_e$ and $T_c$.", in Phys. Lett., 21, 6, 608–609, (1966).

T.A. Fulton et al., "The Flux Shuttle–A Josephson Junction Shift Register Employing Single Flux Quanta", in Proc. IEEE, 61, 28–35 (1973).

T.A. Fulton et al., "Experimental Flux Shuttle", in Appl. Phys. Lett, 22, 232 (1973).

K.K. Likharev and V.K. Semenov, "RSFQ Logic/Memory Family: A New Josephson Junction Technology for Sub–Terahertz–Clock Frequency Digital Systems", in IEEE Trans. On Appl Supercond.,vol.1,no.1,pp. 3–28.

S.V. Polovsky et al., "Rapid Single Flux Quantum Random Access Memory" in IEEE Trans. on App. Supercond., 5, 3000–3005 (1995).

J.J. Hopfiled, "Neural Networks and Physical Systems with Emergent Collective Computational Abilities", in Proc. Natl. Acad. Sci. USA, vol. 79, pp. 2254–2558, Apr. 1982.

M. Hidaka et al., "Circuit Design for a High Tc Josephson Sampler", in IEEE Trans. On App. Supercond., vol. 5, No.2,pp. 3353–3356.

*Primary Examiner*—David C. Nelms
*Assistant Examiner*—Vu A. Le
*Attorney, Agent, or Firm*—Philip J. Feig

[57] ABSTRACT

A superconducting fault-tolerant programmable read-only memory (SFT-PROM) cell stores information in the phases of superconducting wires in a Josephson array. The information is addressable and retrievable in a fault-tolerant manner due to the non local nature of the information stored. The coding and decoding process is content-addressable and parallel due to the multitude of interconnections, resulting in picosecond data access time. The SFT-PROM cell comprises superposed WRITE/READ arrays and a reset circuit that ensures multiple non-destructive read-out of data.

20 Claims, 12 Drawing Sheets

$$I_{94}^{MAX} < I_{96}^{MAX} \cdots < I_{98}^{MAX}$$

$$L_1 > L_2 \cdots > L_n$$

$112 < 114 < 116 < 112 + 114$

1

SUPERCONDUCTING FAULT-TOLERANT PROGRAMMABLE MEMORY CELL INCORPORATING JOSEPHSON JUNCTIONS

FIELD OF THE INVENTION

The present invention relates to memory devices comprising Josephson junctions. More particularly, the invention relates to Josephson circuitry that utilizes flux quanta to code, store and retrieve binary information.

BACKGROUND OF THE INVENTION

The present invention is an improvement over the prior art Josephson junction memory cells. A key component of the prior art Josephson junction memory cell is a superconducting loop containing one or more Josephson junction(s) that stores a persistent circulation current. If the inductance of this loop is sufficiently small, the associated trapped flux assumes a discrete set of values proportional to the single flux quantum (SFQ) and can be used to encode digital information. The logic state of the cell is changed by switching the Josephson junction(s) from its(their) superconducting to resistive state(s); this process in a superconducting quantum interference device (SQUID) occurs at subnanosecond time-scales. In addition, very little energy ($<10^{-18}$ joules) is dissipated during this switching event. Nonetheless, reliable operation is anticipated due to the low level of thermal noise at the cryogenic operating temperatures. Moreover, there is no energy consumption associated with the information storage and the memory is non-volatile. Therefore such SFQ circuitry offers promise for ultrafast memory with high densities that are not limited by the conventional problem of power-dissipation and resultant heat removal.

Though the possibility of SFQ data storage was first proposed by D. J. Dumin et al. in an article entitled "Application of Quantized Trapped Flux in a Superconducting Memory" in J. Appl. Phys., 34, 1566–67 (1963) shortly after the discovery of the Josephson effect in an article by B. D. Josephson entitled "Relation Between the Superfluid Density and Order Parameter for Superfluid $H_e$ Near $T_c$", in Phys. Lett. 21, 6, 608–609, (1966), the main obstacle hindering the practical realization of such devices has been the inconvenience of information read-out. The first SFQ memory cell proposed was the Flux Shuttle, by T. A. Fulton et al. in an article entitled "The Flux Shuttle-A Josephson Junction Shift Register Employing Single Flux Quanta" in Proc. IEEE, 61, 28–35 (1973) and in an article by T. A. Fulton et al. entitled "Experimental Flux Shuttle" in Appl. Phys. Lett, 22, 232 (1973), a transmission line comprising of a parallel connection of the superconducting loops. In effect, the cell performed as a shift register where the position of the SFQ could be controlled by current-biasing a specific junction in the circuit and then driving the junction resistive with a current-pulse. Though several other static SFQ memory cells have been proposed subsequently, they all share a common feature: though digital bits are stored as SFQ, the information is read out as a DC voltage level via a Josephson gate. In order to perform its function as a transducer, the sensing junction must be in the hysteretic regime; thus its reset can only be achieved by switching off the bias current, a process that severely limits the clock frequency of the memory cell.

Josephson Junction devices must use single-flux quanta (SFQ) for both information storage and retrieval in order to maintain their advantage in speed compared with conventional semiconducting transistor memories. Prior art dynamic SFQ circuitry offers such a possibility, where information is passed between logic elements in the form of short voltage pulses with fixed area equal to a single flux quantum (SFQ) as described in an article by K. K. Likharev and V. K. Semenov entitled "RSFQ Logic/Memory Family: A New Josephson Junction Technology for Sub-Terahertz-Clock Frequency Digital Systems" in IEEE Trans. on App. Supercond., vol. 1, no. 1, pp 3–28, March 1991. Recently a dynamic SFQ memory cell has been proposed by S. V. Polovsky et al. In an article entitled "Rapid Single Flux Quantum Random Access Memory" in IEEE Trans. on App. Supercond., 5, 3000–3005 (1995) wherein SFQ pulses code, store and retrieve binary information in a network of single-junction SQUID loops. Though this design represents an important step in the practical realization of high-speed SFQ data storage, its read-out mechanism is fault-intolerant and thus unreliable due to ever present pragmatic difficulties with trapped flux in such an array. Furthermore its read-out procedure is destructive which limits its possible applications to high-density main memory where speed is not a premium concern.

SUMMARY OF THE INVENTION

The present invention provides a Josephson memory cell combining all the positive features of the prior art memory cells, particularly of those employing dynamical SFQ circuitry, and yet exhibiting a fault-tolerant, non-destructive read-out mechanism that is robust to ever present small but finite amounts of trapped flux. Furthermore, it is desirable to provide a dynamical SFQ memory cell that is inherently parallel and content-addressable with an associated image acquisition time per bit that is significantly less than its single-bit access time. Such a Josephson junction device would result in a SFQ storage cell having the capability for accurate data retrieval at picosecond time-scales and being suitable for use as a reliable high-speed cache memory.

The invention has primary application for fault-tolerant ultrafast memory that is compatible with both Josephson and conventional semiconductor configurations. It is particularly applicable to image storage due to its retrieval/address mechanism that is both content-addressable and parallel.

The present invention provides a memory cell comprising a superimposed WRITE/READ array and reset circuit. In an autonomous memory device the SFT-PROM cell is embedded in an environment that includes known input/output SFQ circuitry. The READ array comprises a stack of two mutually perpendicular sets of N superconducting wires coupled by three-dimensional Josephson junctions at each node. Information is stored in the 2N phases of the wires of the array. Patterns are written into the array using a superimposed network of double-junction SQUIDS. Phase configurations corresponding to stored patterns are accessed by sending input SFQ voltage pulses to the horizontal (vertical) set of wires and the resulting output voltage pulses on the vertical (horizontal) wires serve as signatory fingerprints of the superconducting phase configurations in the array. The read-out process can be multiply performed in a non-destructive fashion. Moreover, the resulting memory is parallel, content-addressable and fault-tolerant due to the plurality of interconnections in the superconducting Josephson READ array.

Further and still other objects of the present invention will become more clearly apparent when the following description is read in conjunction with the accompanying drawing

DETAILED DESCRIPTION OF THE INVENTION

Figure 1:
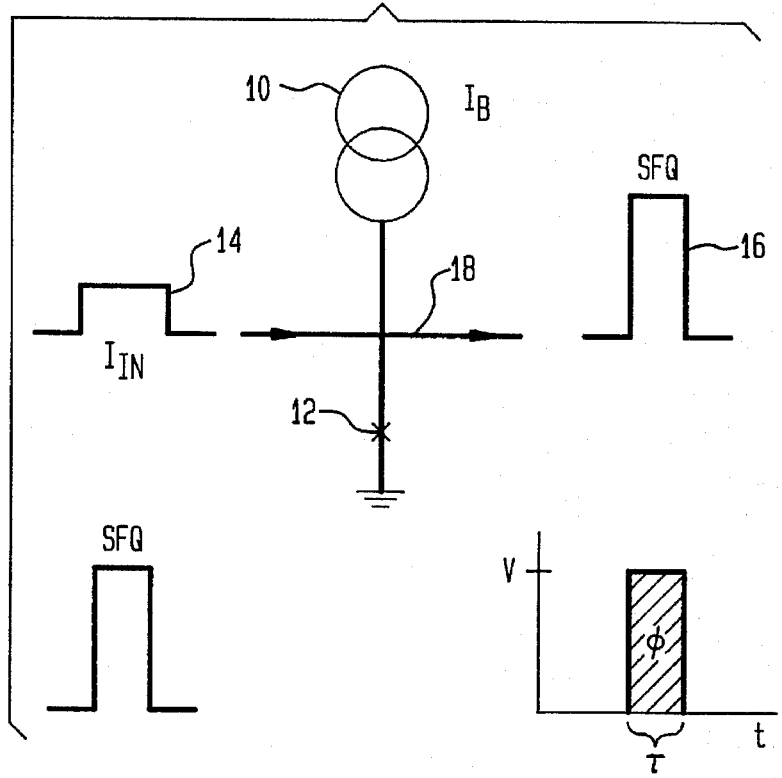
FIG. 1 is a schematic representation of a prior art basic building block of a single-flux quantum (SFQ) circuit.

Referring now to the figures and to FIG. 1 in particular there is shown a basic building block of a prior art single-flux quantum (SFQ) circuit. A DC current source 10 provides a bias current for an underdamped Josephson junction 12 (denoted by a cross) in a circuit. As will be described in more detail below, the procedure for storing digital information as a single-flux quantum (SFQ) requires the presence of an input square-wave current pulse, $I_{IN}$ 14, which drives the junction 12 from its initial superconducting state to a resistive state. This process is accompanied by the generation of a single-flux quantum (SFQ) in the form of a fixed-area voltage pulse 16. If the junction 12 is included in a superconducting loop, the generated flux quantum will be trapped; otherwise the SFQ pulse will propagate to the right end of the bit line 18.

Figure 2:
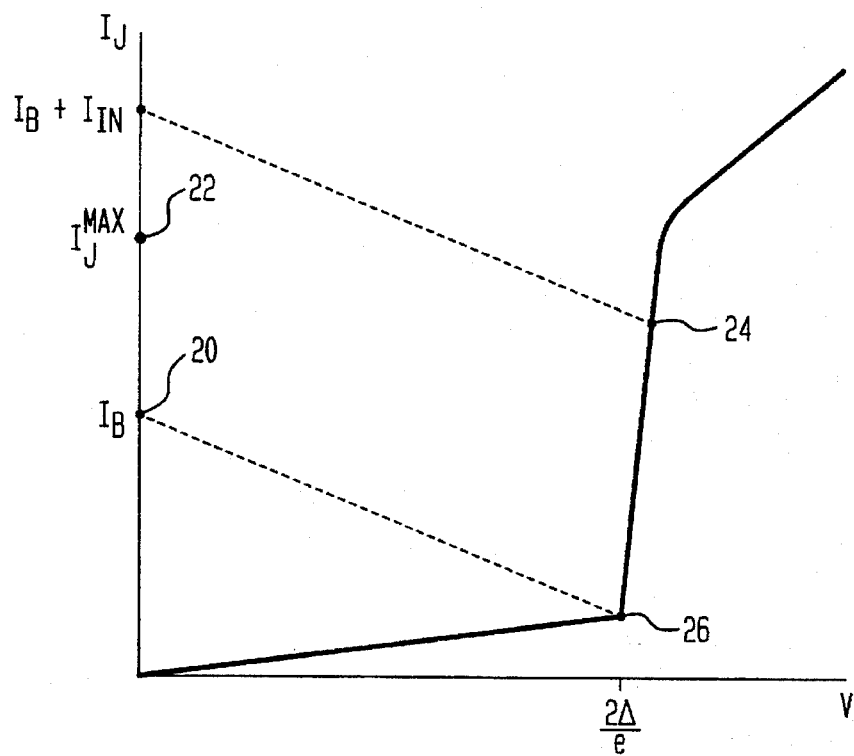
FIG. 2 is a graphical representation of the current-voltage characteristics for an underdamped (hysteretic) Josephson junction.
Figure 3:
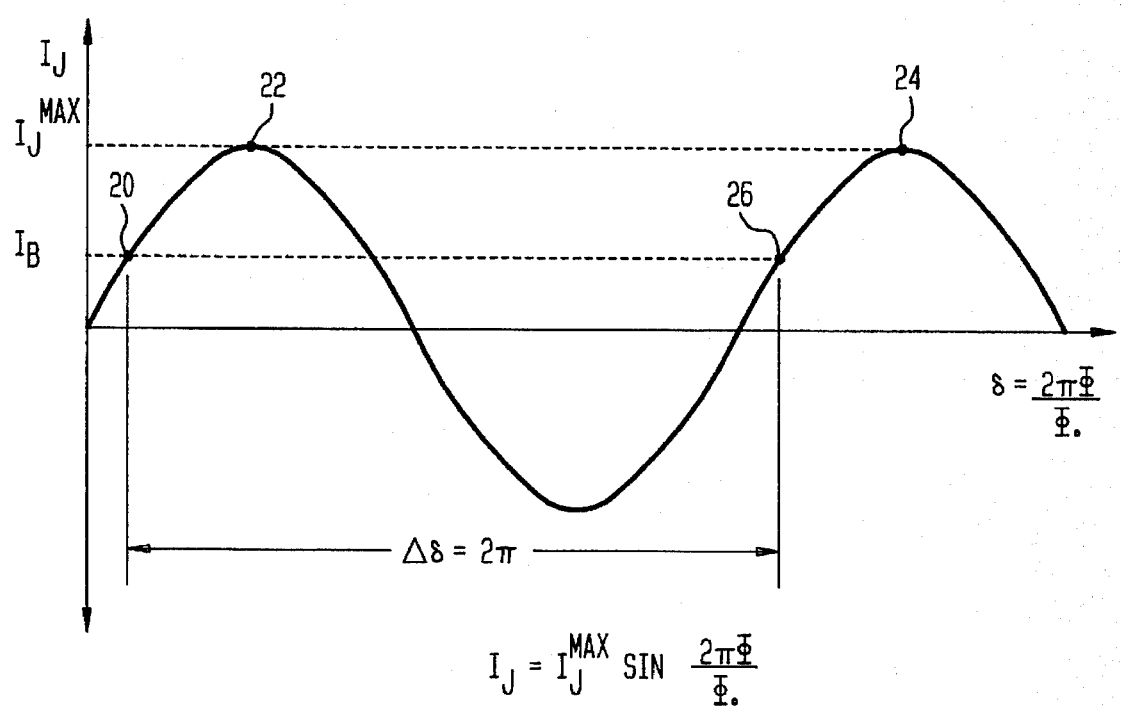
FIG. 3 is a graphical representation of the current-phase relation for a Josephson junction.

A current-voltage characteristic for an underdamped Josephson junction is shown in FIG. 2. The current-phase relation for a Josephson junction is shown in FIG. 3. In both FIG. 2 and FIG. 3 the critical current of the junction 12 is denoted by $I_J^{MAX}$. The function of the circuit in FIG. 1 can be understood by considering a series of four simple time-steps labeled as 20, 22, 24 and 26 in FIG. 2 and FIG. 3. At time 20 Josephson junction 12 in FIG. 1 is biased with a current $I_B$ that is subcritical as shown in FIG. 2 so that the Josephson function remains in its initial superconducting state. An incoming current pulse $I_{IN}$ propagates into the circuit from the left side (as shown) of the bit line 18 at time 22. The sum of the currents $I_B$ and $I_{IN}$ is made to be greater than $I_J^{MAX}$. At time 24, the junction 12 switches from its superconducting state to its resistive state. In the process, a phase slip occurs as indicated in FIG. 3 at time 24. The result is a single-flux quantum (SFQ) pulse 16 as shown in FIG. 1. Once the current pulse $I_{IN}$ has passed (at time 26), the junction 12 is once again biased with the subcritical current $I_B$. Josephson junction 12 cannot return to its initial superconducting state with a finite current $I_B$ due to its intrinsic hysteresis. As a result, a reset procedure that involves the complete shut-down of the current 1s is essential for the accurate functioning of the circuit, and results in a severe constraint on the circuit clock frequency.

Figure 4:
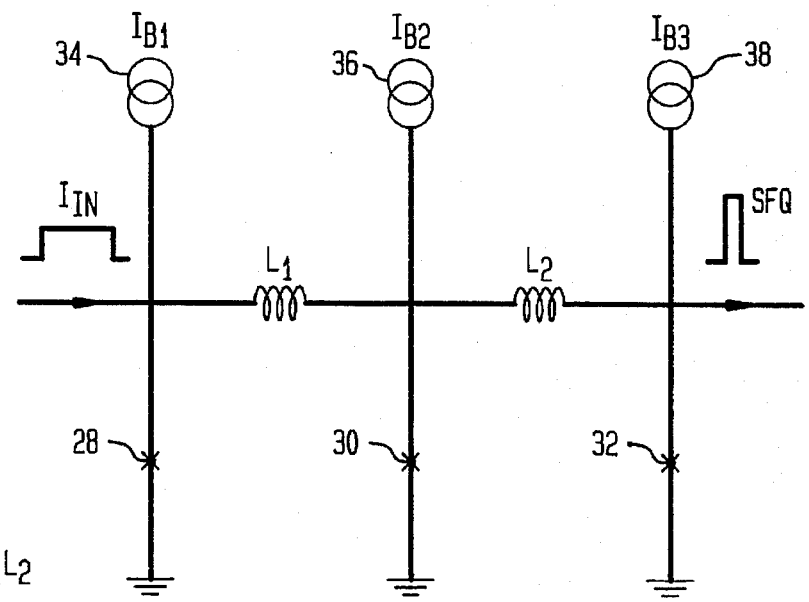
FIG. 4 shows a prior art flux transmission line including a Josephson transmission line.

FIG. 4 shows a prior art flux transmission line including a Josephson transmission line comprising a series of the basic circuits of the type shown in FIG. 1. The flux shift register operates according to the same principle ms described in conjunction with FIG. 1. A particular junction, for example Josephson junction 28 in FIG. 4, is biased with a subcritical current $I_{B1}$ from source 34. An input current pulse $I_{IN}$ results in the generation of a SFQ pulse and the trapping of a SFQ in the loop containing junction 28 and junction 30. The result is that the SFQ has shifted one loop to the right. In this manner the SFQ can be shifted along the entire transmission line, one register at a time. This circuit is one of the earliest proposals for digital SFQ storage as described in Fulton et al. supra.

Figure 5:
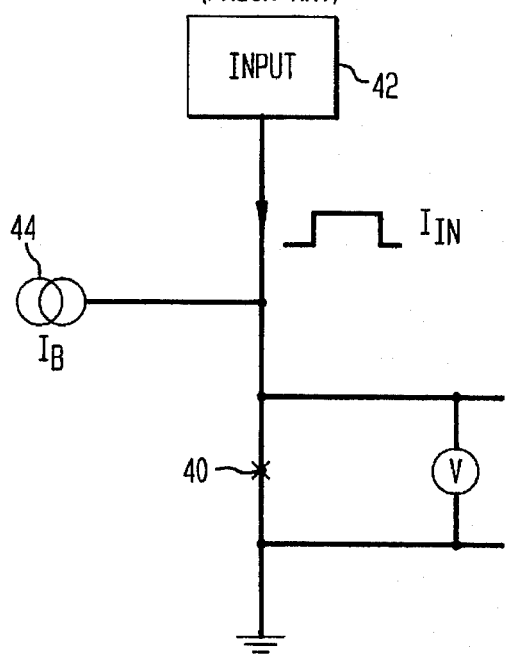
FIG. 5 is a schematic representation of a prior art latching circuit for a memory cell that utilizes a Josephson junction as a transducer.

Although the single bits are coded as SFQ, they are read out using a prior art latching circuit schematically shown in FIG. 5. The underdamped junction 40 acts as a transducer that converts the input signal $I_{IN}$ from input circuit 42 into a DC voltage. The junction 40, like the junction 12 in FIG. 1, is hysteretic and biased with a subcritical current $I_B$ from current source 44. The input current pulse $I_{IN}$ drives the junction 40 into a resistive state thereby generating a DC voltage that is read as information. The circuitry shown in FIG. 4 could reside in the input circuit 42 of FIG. 5. The primary criterion for the input circuit 42 is that it must generate a current pulse $I_{IN}$ sufficient to drive the sensing junction 40 from a superconducting state into a resistive state. Even though the information in input circuit 42 may be stored as single-flux quanta as shown in FIG. 4 it is decoded as a DC voltage thereby constraining the speed of the circuit. Furthermore, the sensing junction must be underdamped. As described above, the reset procedure provides an upper limit on the clock frequency of the superconducting circuit, thereby relinquishing its key advantage over semiconducting circuitry.

Figure 6A:
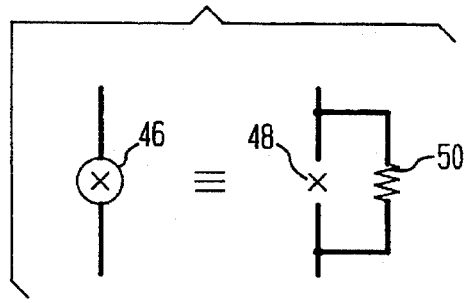
FIG. 6A is a schematic illustration of an overdampened Josephson junction.
Figure 6B:
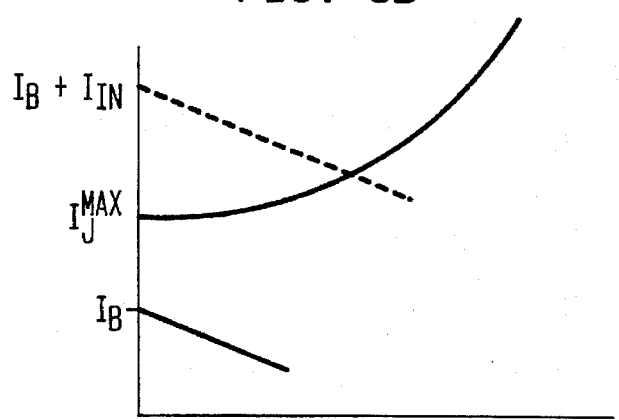
FIG. 6B is a graphical representation of an idealized current-voltage characteristic of the Josephson junction shown in FIG. 6A.
Figure 7:
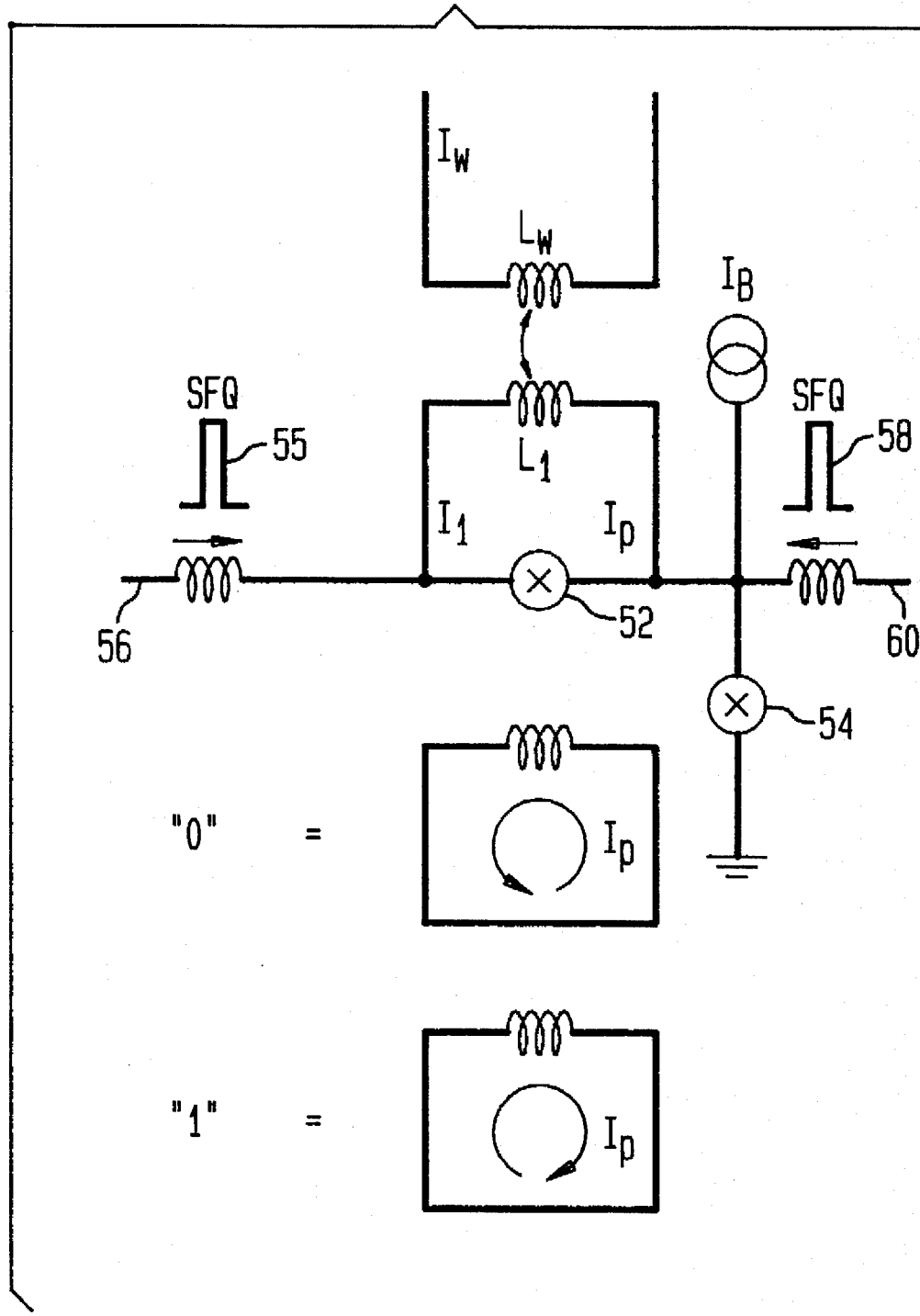
FIG. 7 show a schematic of the prior art single-flux quantum (SFQ) memory cell.

The reset problem can be overcome by reducing the effective resistance of the Josephson junctions used as described in K. K. Likharev et al. supra. A schematic representation of an overdamped junction is shown in FIG. 6A. The overdampened junction 46 may be thought of schematically as a conventional Josephson junction 48 shunted by a resistance 50. The idealized current-voltage characteristic of such a non-hysteretic junction is shown in FIG. 6B. The overdamped Josephson junction 46 plays a key role in improved prior art dynamic. SFQ circuitry because it can be switched reversibly between the superconducting and the resistive states. FIG. 7 shows a schematic representation of a prior art single flux quantum (SFQ) memory. The two binary states of the cell correspond to a clockwise ("1") or counterclockwise ("0") persistent current $I_p$ in the single-junction loop SQUID shown in FIG. 7 where the junctions 52 and 54 are both overdamped. The particular cell is selected with a counterclockwise word current $I_w$ such that if the SQUID is in a "0" state the two currents, $I_p$ and $I_1=I_w L_w/L_1$, add so that junction 52 is barely subcritical. An incident SFQ pulse 55 propagating from the left side of the bit line 56 (as shown) drives junction 52 into a resistive state, and a flux quanta is trapped in the SQUID thereby switching its logic state to "1". Alternatively, if this cell had originally been in "1", the currents $I_1$ and $I_p$ would have different signs. Consequently, junction 52 would not be just below critically and thus would not be driven to its resistive state by the SFQ 55 pulse. The pulse would simply continue to travel along the bit line, having switched junction 54.

The reading procedure is very similar to the writing process described above. The cell is selected with a clockwise word current and a SFQ pulse is sent along the bit line from the right side. If the cell is in state "0", $I_p$ and $I_1$ have opposite signs and the junction remains unchanged with the SFQ input 58. The pulse 58 continues along the bit line. However if the cell is in "1", the SFQ pulse terminates at the cell, a SFQ is absorbed and the cell switches back to state "0".

The circuit design shown in FIG. 7 provides an advance in the art because it is the first Josephson memory design where information is coded, stored and decodes as flux quanta. However, this improved SFQ memory stores its binary information locally and thus is not robust to unavoidable flux trapping that would render it inaccurate and unreliable.

Figure 8:
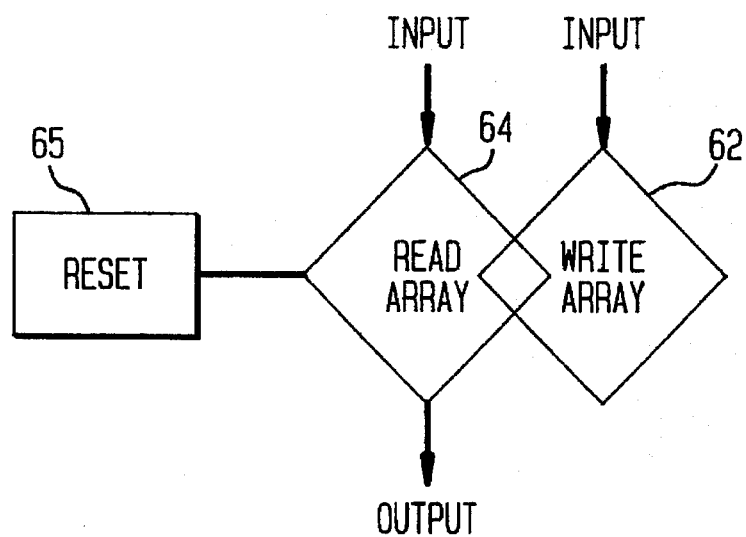
FIG. 8 is a block diagram of a preferred embodiment of a Superconducting Fault-Tolerant Programmable Read-Only Memory (SFT-PROM)cell forming the present invention.

FIG. 8 is a block diagram of a preferred embodiment of a Superconducting Fault-Tolerant Programmable Read-Only Memory (SFT-PROM) forming the present invention. The SFT-PROM cell comprises superimposed write arrays 62 and read arrays 64 and a phase reset. The input/output port connections are indicated.

Figure 9:
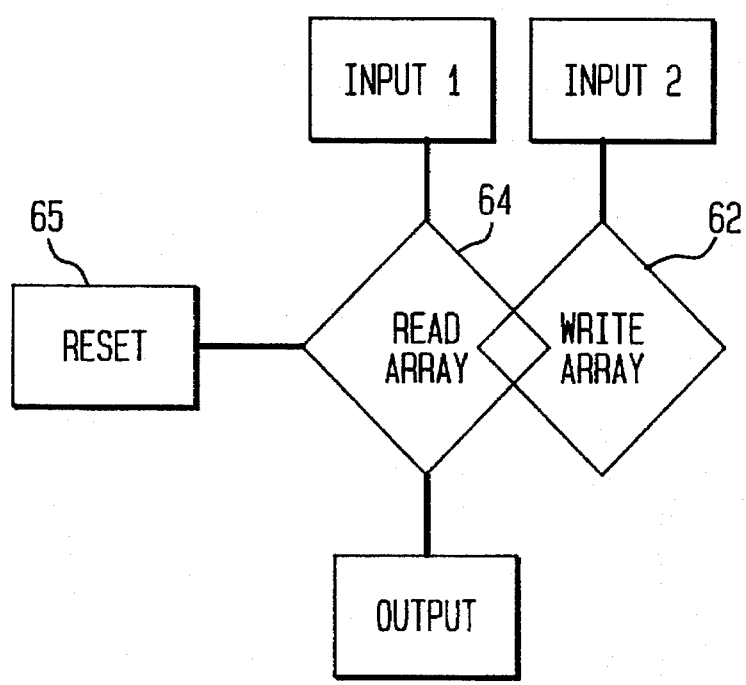
FIG. 9 is a block diagram of an autonomous pilot memory device that incorporates a SFT-PROM cell embedded in a test environment that includes known input/output SFQ circuitry.

FIG. 9 is a block diagram of a autonomous pilot memory device that incorporates the SFT-PROM cell embedded in a test environment that includes known input/output SFQ circuitry. The details of each component of the block diagram will now be described in detail.

Figure 10A:
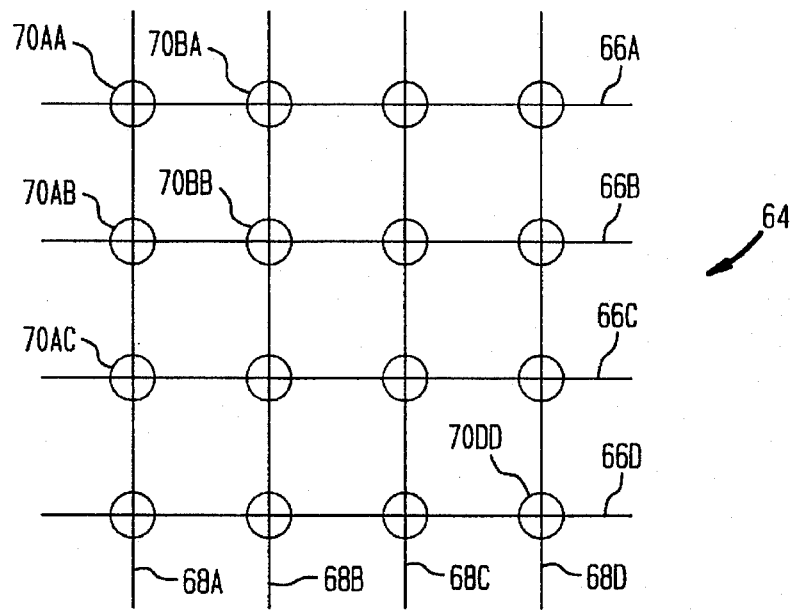
FIG. 10A is a schematic representation of a READ array forming a part of the present invention.
Figure 10B:
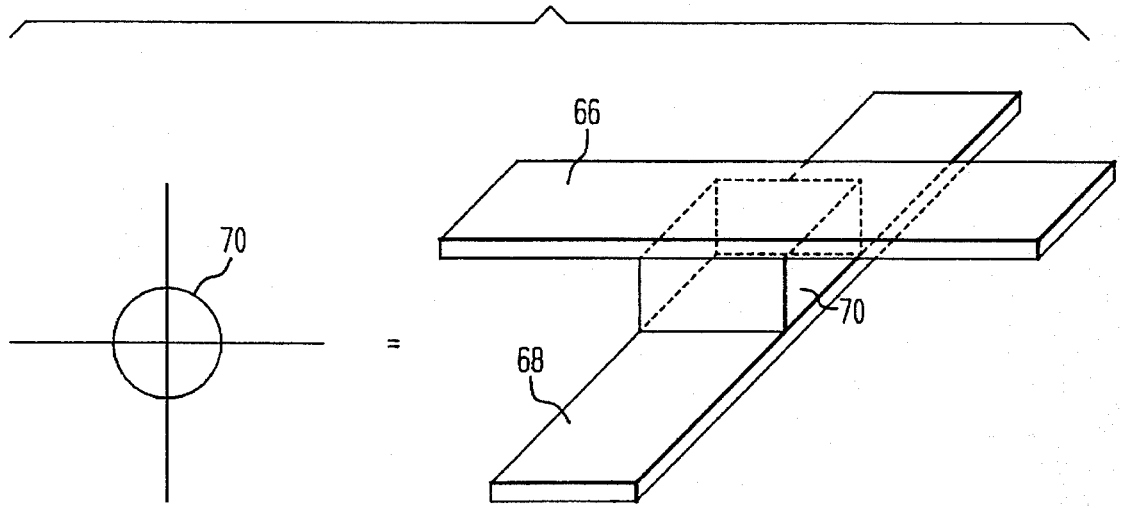
FIG. 10B is a three-dimensional Josephson junction.

The READ array 64 is shown systematically in FIG. 10A comprising an array of two mutually perpendicular sets of N superconducting wires 66, 68 where a three-dimensional Josephson junction 70, as shown in FIG. 10B, is formed at each intersection of wires, i.e. at each node. The SFT-PROM cell information is stored as N-bit images. Each image is addressed and retrieved in the form of N values of the superconducting phases of the vertical (as shown) wires 68 in the READ array. This information is coded by a flux configuration penetrating the READ array. This flux configuration is fixed by a super-imposed WRITE array to be described in detail below. Since information is retrieved and addressed in nonlocal fashion in the READ array these processes are fault-tolerant to input errors. For an array of 2N wires, the storage capacity is $\alpha N^2 \sim 0.1N^2$ or 100 Kbits for N=1000. The single-bit data access time $\tau_A$ is set by the inverse-gap of the superconductor used for the wires, and is on picosecond time-scales. Moreover, since the memory cell is intrinsically content-addressable and parallel due to the large number of interconnections, an image of N bits can be retrieved in a time (per bit)

$$\tau_{DT} \sim \frac{n\tau_A + \tau_{RS}}{N}$$

where n is of the order of unity, and $\tau_{RS}$ is the time associated with the reset circuit to be discussed below. By contrast, in a conventional local memory $\tau_{DT} \sim \tau_A$. Stored patterns, encoded using the write circuitry described below, are chosen to minimize the energy function of the array which can be done following, for example, the Hopfield prescription described in an article by J. J. Hopfield entitled "Neutral Networks and Physical Systems with Emergent Collective Computational Abilities" in Proc. Nat. Acad. USA, 79, 2554–558 (1982). Each stored image corresponds to a given configuration of the 2N superconducting phases. The associated signatory fingerprint of each image can be determined using voltage pulses. More specifically, a set of SFQ pulses can be applied to each of N horizontal wires 66 thereby altering the phases of the nodes 70. As a result of the couplings at the nodes, the phases of the vertical wires 68 are affected and must readjust in order to minimize the overall energy function of the array 64, a process that can be characterized by output voltage pulses. The set of N input and N output voltage pulses constitutes a fingerprint of a given stored pattern, and a simple input/output dictionary can be established. The inputs are provided at the top (as shown) of wires 68, and the outputs are provided at the bottom (as shown) of wires 68. It will be understood by those skilled in the art that terms used such as horizontal, vertical, top, bottom and so forth are provided merely for convenience of understanding the invention as shown in the figures. The directions, orientation and terms may be changed to fit the actual physical embodiment employed.

Since the images are stored nonlocally in the array, the number of input voltage pulses M can be much less $\sqrt{N} \leq M \ll N$ than N and still result in the complete and exact recovery of the N output pulses that constitute a fingerprint of the stored image. Similarly the set of N output signals is robust to inaccuracies in the input pulses. In this sense, the memory array is fault-tolerant and thus is reliable and accurate in the presence of input errors. Any subset of the N inputs yields the full output pulse set, so that the data addressing and reading mechanisms of the proposed network are content-addressable. Moreover, since the phases coding the digital information evolve simultaneously, these retrieval and addressing procedures are inherently parallel.

Figure 11:
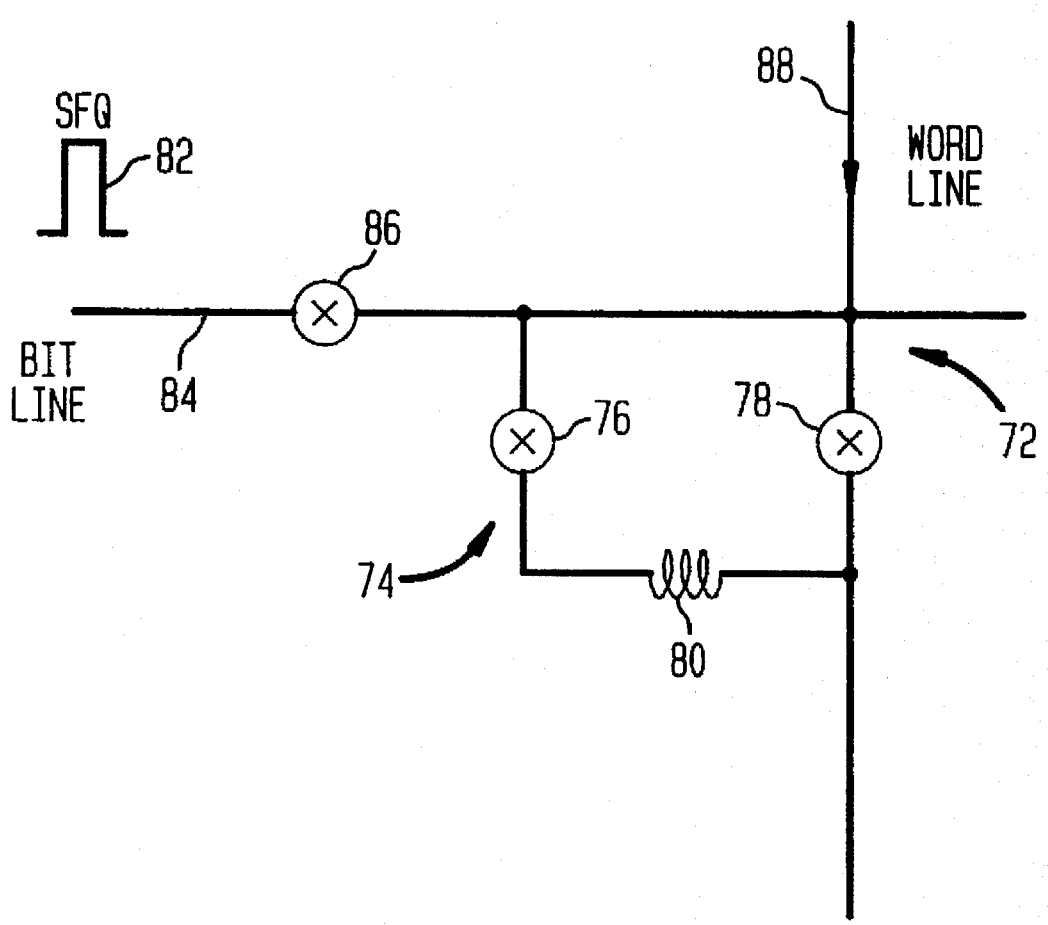
FIG. 11 is a schematic representation of an elementary subcell of the WRITE array.

FIG. 11 shows schematically an elementary subcell 72 of the WRITE array 62. The key component of the subcell 72 is a double-junction SQUID 74 which contains two overdamped junctions 76, 78 and an inductance 80 whose value is chosen so that the SQUID has two possible logic states corresponding to the presence of a half flux quantum. The switching mechanism here is similar to that described in conjunction with FIG. 1. If the junctions 76, 78 are selected with a current-bias then a single SFQ pulse 82 propagating from the left side of the bit line 84 will switch the state of the SQUID 74. The overdamped junction 86 on the bit line 84 decouples the subcell from its neighbors so that each SQUID can be addressed individually.

Figure 12:
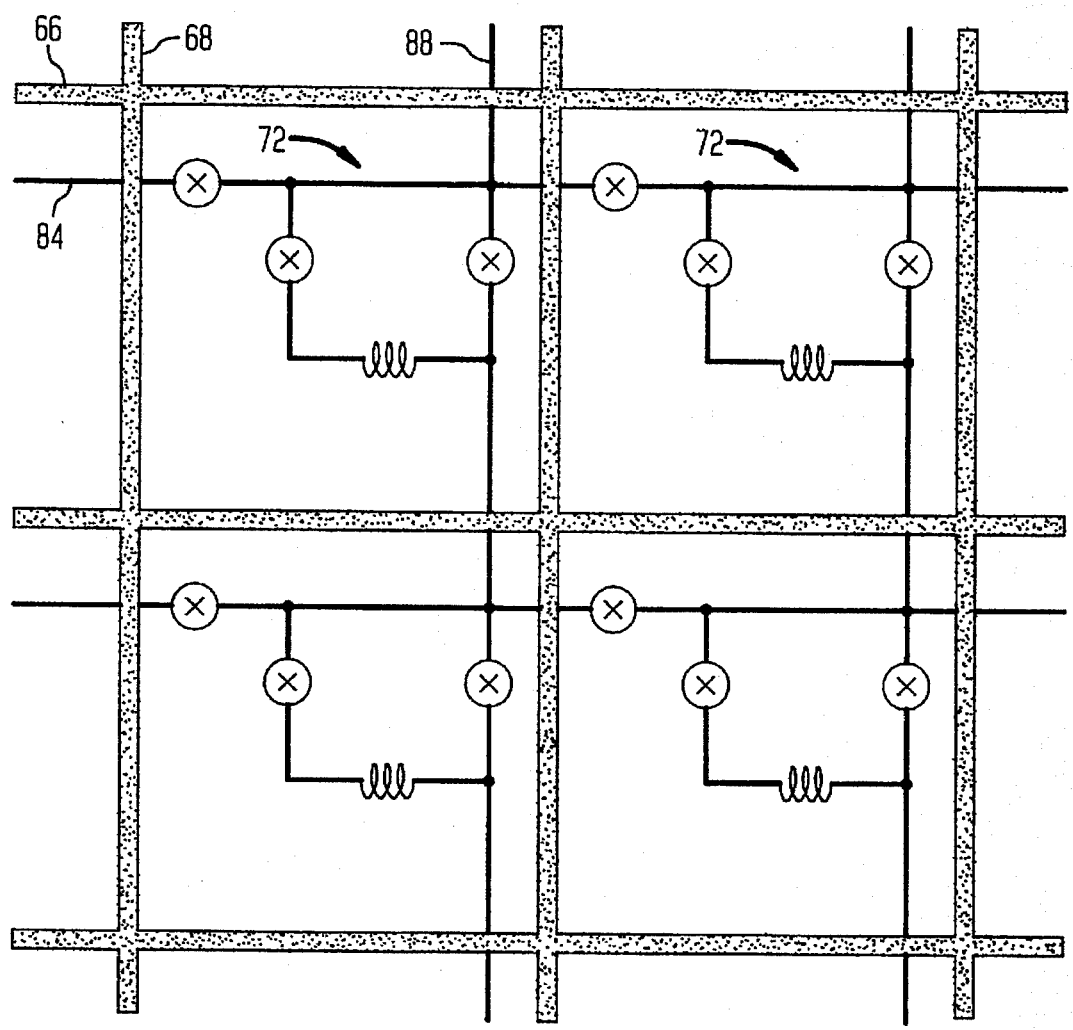
FIG. 12 is a schematic representation of the superimposed write/read arrays.

In FIG. 12, a schematic representation of the WRITE array comprising a periodic network of the subcell 72 described in FIG. 11, is shown superimposed in the READ array 64 shown in FIG. 10. Fluxes generated and pinned by individual subcells 72 of the WRITE array 62 penetrate into the READ array 64 thereby imposing phase configurations associated with stored patterns. In order to generate the flux configuration corresponding to the required set of images, each subcell of the WRITE array 62 has to be addressed individually. This is achieved by selecting the appropriate word line 88 and bit line 84. The flux configurations must be chosen so that the associated set of phases of the READ array correspond to the stored images. Several algorithms exist relating the flux configurations to the stored inmges, including for example the Hopfield prescription.

Figure 13:
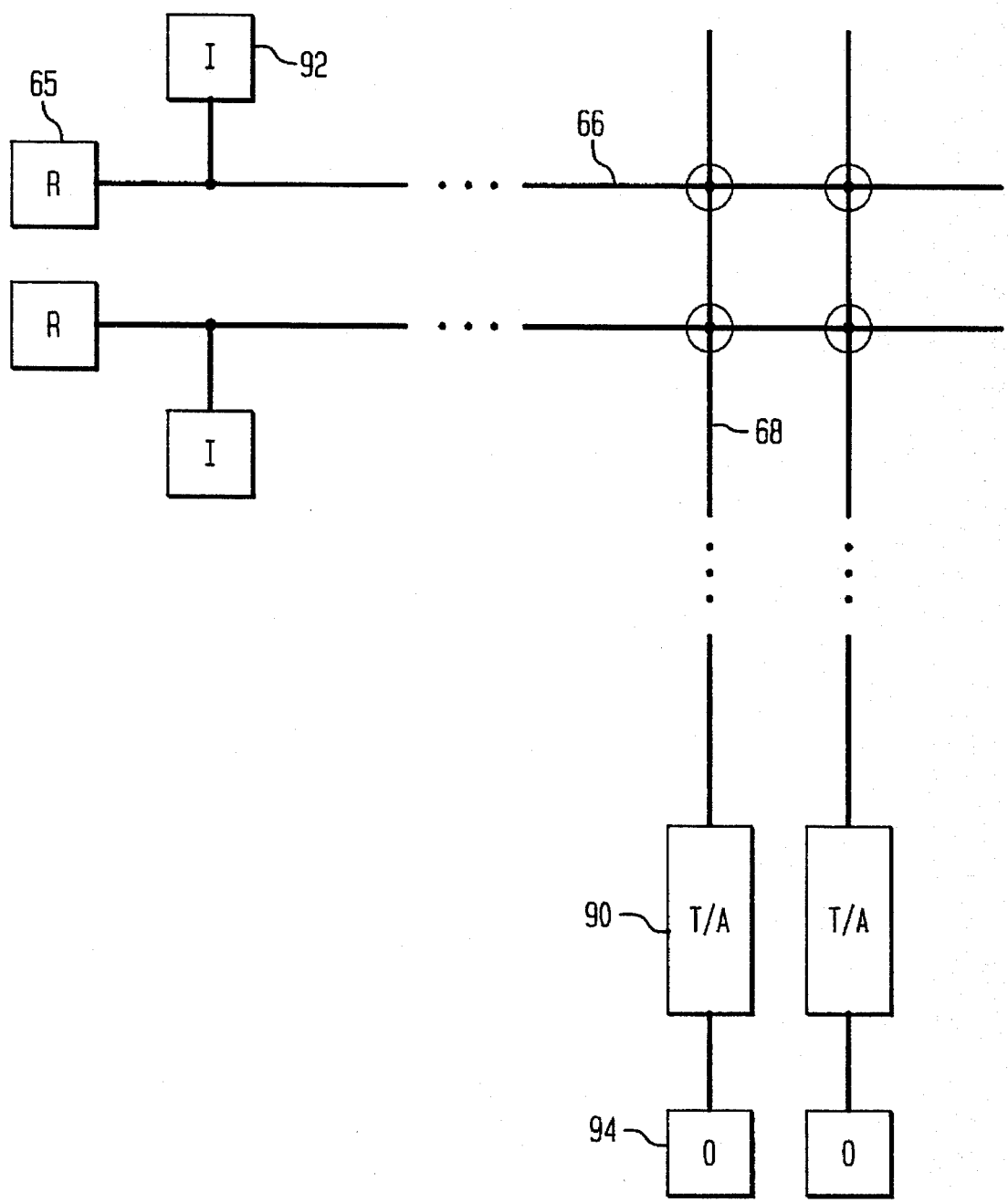
FIG. 13 is a block diagram shown the connections between the SFT-PROM cell and the Input (I), Output (O), Reset (R) and the Transmission/Amplification (T/A) line circuits.

FIG. 13, illustrates schematically the connections between the READ array 64, reset circuitry 65, transmission/amplification lines 90 and input 92/output 94 circuits. A reset circuit 65 and input circuit 92 are attached to each horizontal wire 66 of the READ array 64. A transmission/amplification line 90 and an output circuit 94 is connected to each of the vertical wires 68 of the READ array 64.

Figure 14:
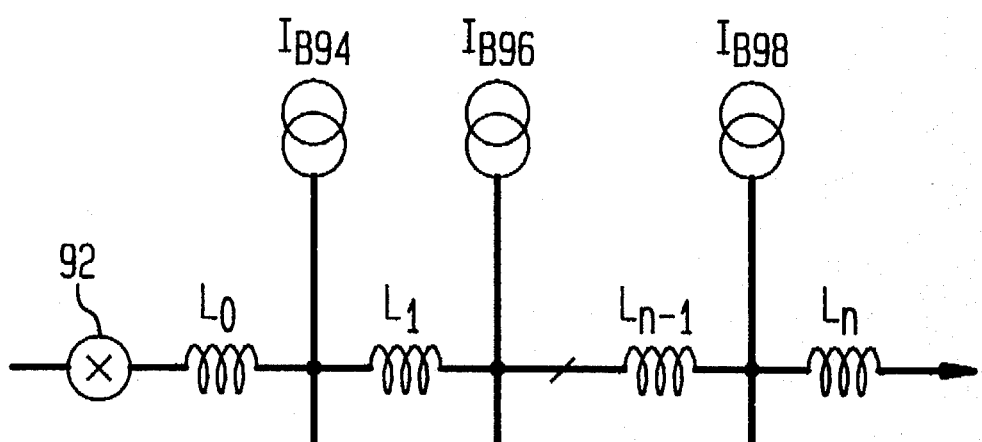
FIG. 14 is a schematic representation of a Single-Flux Quantum Transmission/Amplification line.

FIG. 14 shows a SFQ transmission/amplification line 90. Its operation is similar to that described in conjunction with FIG. 4, except that its junctions are non-hysteretic and are current-biased so that the SFQ pulse propagates without becoming trapped. The inductances $L_0, L_1, \ldots, L_{n-1}, L_n$ and the critical junction currents are chosen in decreasing and increasing sequence respectively, as shown, in order to increase the power of the SFQ pulse as it propagates along the transmission line. The junction 92 serves to decouple the phase of the transmission line from that of the READ array 64.

Figure 15:
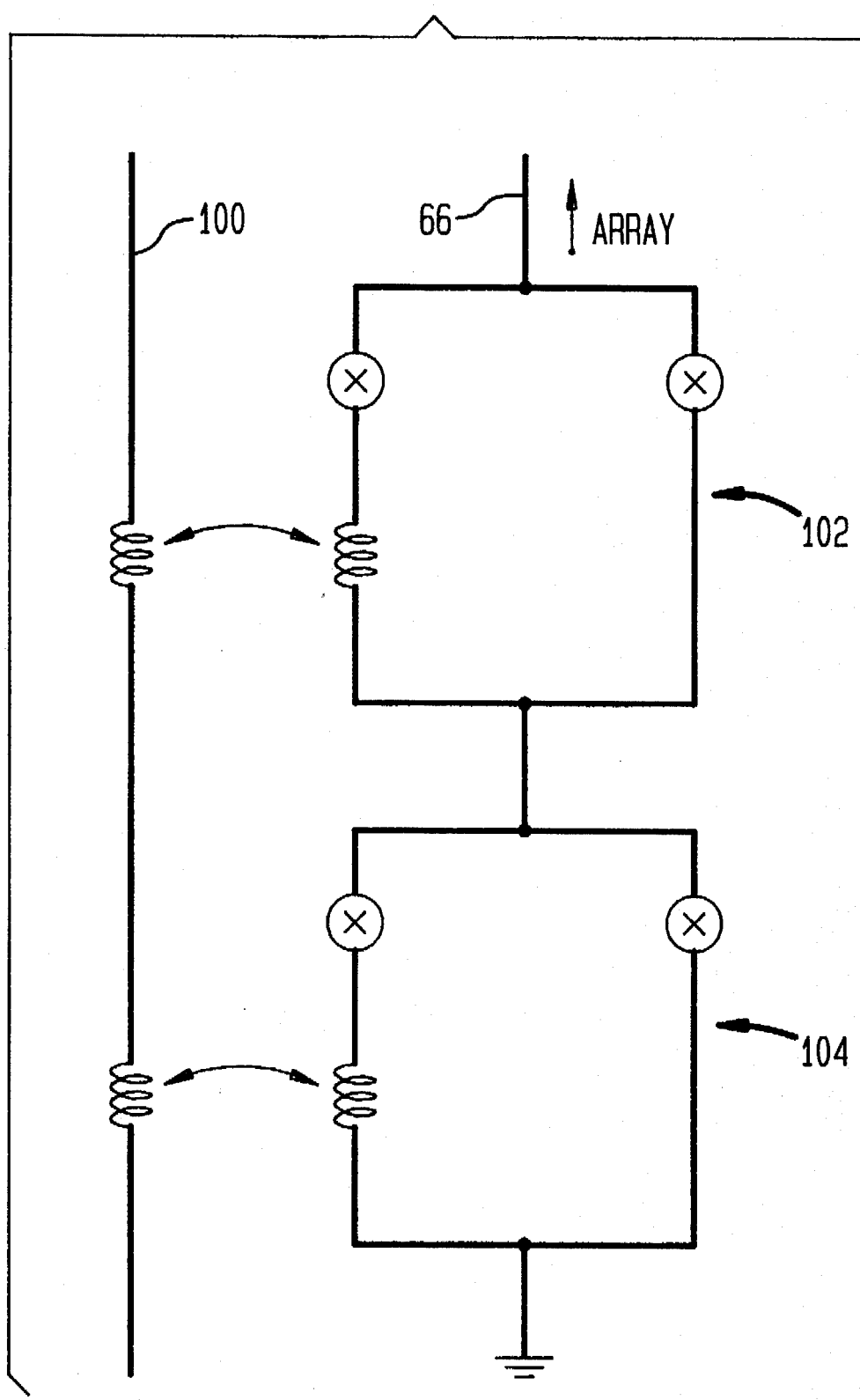
FIG. 15 is a schematic representation of a phase reset circuit.

The phase reset circuit 65 is shown in FIG. 15. Each data retrieval event in the READ array must be followed by a reset operation since the output signals correspond to the phase differences with respect to a reference state. In the absence of a field bias, provided by a reset control line 100, the series of double-junction SQUID loops 102, 104 couples a wire 66 of the READ array 64 to ground thereby completely locking its phase in a reference state. In the presence of a control line current, chosen so that it induces one-half a flux quantum in each SQUID loop, the critical currents of the two junctions in each SQUID cancel each other and the net critical current of each SQUID is effectively zero. As a result, the phase of the wire 66 of the READ array is no longer coupled to ground and the next data retrieval process can be performed. In order to make this reset mechanism robust to errors associated with junction parameters and the specific value of the induced flux, a series of two SQUID loops might be used as shown. A longer series of SQUID loops can be used to accommodate a large tolerance margin.

Figure 16:
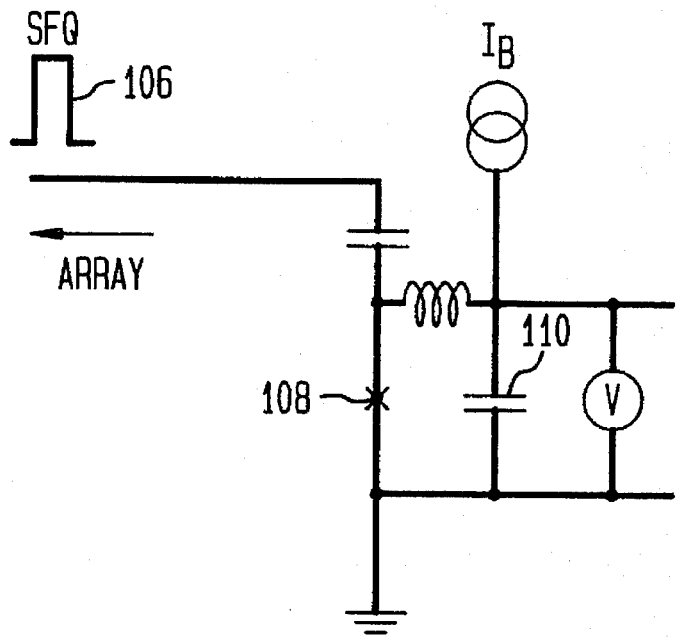
FIG. 16 is a schematic representation of an output circuit.

The output circuit 94 is shown in FIG. 16. A SFQ pulse 106 arrives from the transmission/amplification line 90 of FIG. 14 and drives the biased underdamped sensing junction 108 to its resistive state, a process which results in a DC voltage V that can be detected by conventional semiconducting electronics. The capacitor 110 in the input line serves to decouple, the READ array 64 from any stray DC voltage in the output circuit generated by the resistive-state Josephson junction 108.

Figure 17:
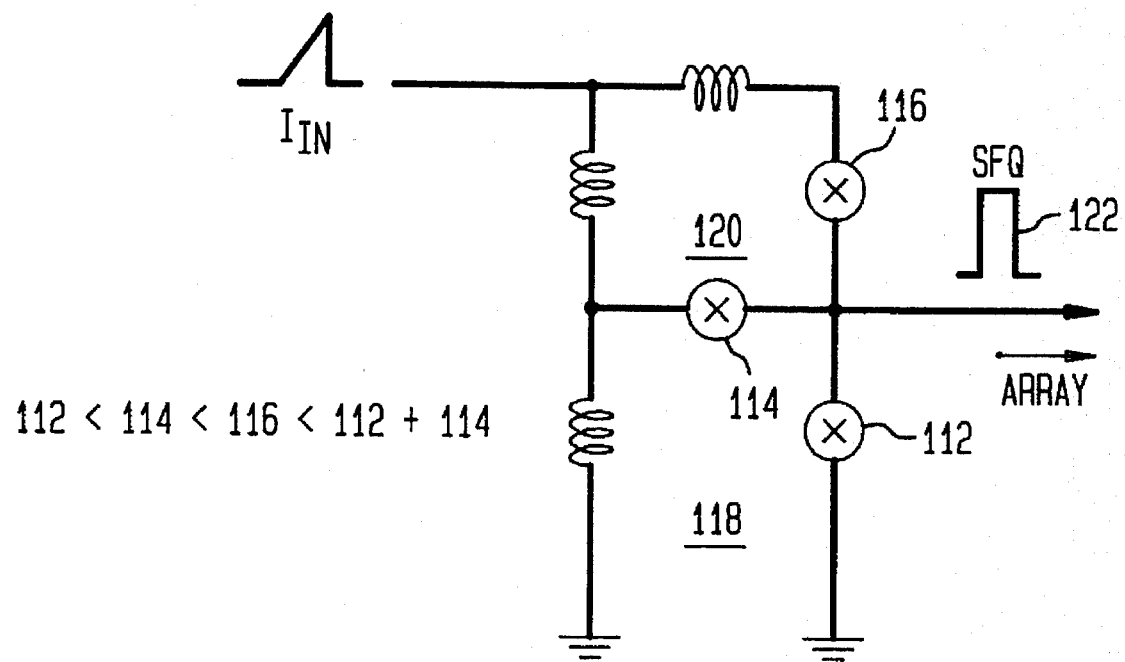
FIG. 17 is a schematic representation of an input circuit.

The input circuit 92 is shown in FIG. 17 which is a DC/SFQ voltage pulse converter. A sawtooth current pulse $I_{IN}$ results in the sequential switching of Josephson junctions 112, 114 and 116 with the result that a flux quantum passes from loop 118 to loop 120 and finally exits the circuit as a SFQ voltage pulse 122 which then serves as an input signal to an individual horizontal wire 66 of the READ array 64

While there has been described and illustrated a preferred embodiment of a superconducting full-tolerant programmable memory use (SFT PROM) cell incorporating Josephson junctions, it will be apparent to above skilled in the art that variations and modifications are possible without deviating from the broad principles and spirit of the present invention which shall be limited solely by the scope of claims appended hereto.

What is claimed is:

1. A superconducting fault-tolerant programmable memory cell comprising:

N bit lines of superconducting wires disposed in substantially parallel relation to one another;

N word lines of superconducting wires disposed in substantially parallel relation to one another, said word lines being superimposed with said bit lines and being disposed substantially orthogonally with respect to said bit lines; and N×N nodes of Josephson junctions, a junction being formed at each of the intersections of said bit lines and said word lines, comprising a READ array to address stored information in the form of a N-bit image.

2. A superconducting fault-tolerant programmable memory cell as set forth in claim 1, where the stored information is stored as flux quanta.

3. A superconducting fault-tolerant programmable memory cell as set forth in claim 2, further comprising read-out means for non-destructively reading out data at picosecond time scale.

4. A superconducting fault-tolerant programmable memory cell as set forth in claim 1, further comprising a reset circuit.

5. A superconducting fault-tolerant programmable memory cell as set forth in claim 1, where said READ array to address stored information is content-addressable.

6. A superconducting fault-tolerant programmable memory cell as set forth in claim 1, where said READ array to address stored information is parallel addressable.

7. A superconducting fault-tolerant programmable memory cell as set forth in claim 1, further comprising a WRITE array superimposed in said READ array.

8. A superconducting fault-tolerant programmable memory cell as set forth in claim 7, where said WRITE array includes subcells comprising double-junction SQUID.

9. A superconducting fault-tolerant programmable memory cell as set forth in claim 8, further comprising a reset circuit.

10. A superconducting fault-tolerant programmable memory cell as set forth in claim 7, further comprising a reset circuit.

11. A superconducting fault-tolerant programmable memory cell comprising:

N bit lines of superconducting wires disposed in substantially parallel relation to one another;

N word lines of superconducting wires disposed in substantially parallel relation to one another, said word lines being superimposed with said bit lines and being disposed substantially orthogonally with respect to said bit lines; and N×N nodes of Josephson junctions in superconducting phase, a junction being formed at each of the intersections of said bit lines and said word lines, comprising a READ array to retrieve stored information in the form of a N-bit image.

12. A superconducting fault-tolerant programmable memory cell as set forth in claim 11, where the stored information is stored as flux quanta.

13. A superconducting fault-tolerant programmable memory cell as set forth in claim 12, further comprising read-out means for non-destructively reading out data at picosecond time scale.

14. A superconducting fault-tolerant programmable memory cell as set forth in claim 11, further comprising a reset circuit.

15. A superconducting fault-tolerant programmable memory cell as set forth in claim 11, where said READ array to retrieve stored information is content-addressable.

16. A superconducting fault-tolerant programmable memory cell as set forth in claim 11, where said READ array to retrieve stored information is parallel addressable.

17. A superconducting fault-tolerant programmable memory cell as set forth in claim 11, further comprising a WRITE array superimposed in said READ array.

18. A superconducting fault-tolerant programmable memory cell as set forth in claim 17, where said WRITE array includes subcells comprising double-junction SQUID.

19. A superconducting fault tolerant programmable memory cell as set forth in claim 18, further comprising a reset circuit.

20. A superconducting fault-tolerant programmable memory cell as set forth in claim 17, further comprising a reset circuit.

* * * * *